United States Patent
Grosche et al.

(10) Patent No.: US 9,985,597 B2
(45) Date of Patent: May 29, 2018

(54) DIGITAL COMPRESSOR FOR COMPRESSING AN AUDIO SIGNAL

(71) Applicant: Huawei Technologies Co., Ltd., Shenzhen (CN)

(72) Inventors: Peter Grosche, Munich (DE); Yue Lang, Beijing (CN); Qing Zhang, Munich (DE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days. days.

(21) Appl. No.: 15/082,081

(22) Filed: Mar. 28, 2016

(65) Prior Publication Data

US 2016/0211821 A1 Jul. 21, 2016

Related U.S. Application Data

(63) Continuation of application No. PCT/EP2014/051795, filed on Jan. 30, 2014.

(51) Int. Cl.
*H03G 9/00* (2006.01)
*H03G 7/00* (2006.01)
*H03G 9/18* (2006.01)

(52) U.S. Cl.
CPC ............ *H03G 7/002* (2013.01); *H03G 7/007* (2013.01); *H03G 9/18* (2013.01)

(58) Field of Classification Search
CPC . H04R 3/007; H04R 3/04; H04R 3/12; H04R 3/14; H04R 2400/01;

(Continued)

(56) References Cited

U.S. PATENT DOCUMENTS 5,724,433 A * 3/1998 Engebretson .......... H04R 25/70 381/106
6,757,396 B1 6/2004 Allred
(Continued)

FOREIGN PATENT DOCUMENTS

| CN | 1627636 A | 6/2005 |
|---|---|---|
| CN | 101048935 A | 10/2007 |
| EP | 1923994 A1 | 5/2008 |

OTHER PUBLICATIONS

Zolzer, U., "Digital Audio Signal Processing," Second Edition, 2008, 334 pages.

(Continued)

*Primary Examiner* — Leshui Zhang
(74) *Attorney, Agent, or Firm* — Conley Rose, P.C.

(57) ABSTRACT

A digital compressor for compressing an input audio signal is presented. The digital compressor comprises a compression gain control for providing a compression gain parameter, and a compression parameter determiner for determining a compression ratio from the compression gain parameter. The compression parameter determiner may be configured to weight the compression gain parameter by a predetermined weight factor to obtain the compression ratio. The digital compressor further comprises an auxiliary signal generator for manipulating the input audio signal in dependence of the compression ratio to obtain a first auxiliary signal, and a combiner unit for combining the first auxiliary signal with the compression gain parameter to obtain a second auxiliary signal, and for combining the input audio signal with the second auxiliary signal to obtain the compressed audio signal.

18 Claims, 16 Drawing Sheets

(58) Field of Classification Search
CPC ...... H04R 2400/13; H03G 7/00; H03G 7/002;
H03G 7/005; H03G 7/04; H03G 7/06;
H03G 7/007; H03G 7/08; H03G 11/00;
H03G 3/00; H03G 9/06; H03G 9/10;
H03G 9/14; H03G 9/16; H03G 9/18;
H03G 9/20; H03G 11/006; H03G 11/008;
H03G 11/04; H03G 11/08; H03G
2201/502; H03G 2201/504; H03G
2201/506; H03G 2201/508; H03G
2201/606; H03G 2201/702; G10L 19/00;
G10L 19/167; G10L 19/24; G10L 21/038;
G11B 20/10527; H03F 13/00
USPC .... 381/8–103, 104–110, 317, 318, 320, 321,
381/302, 332–334, 120, 119; 700/94;
704/500, E19.001
See application file for complete search history.

(56) References Cited

U.S. PATENT DOCUMENTS

| | | | |
|---|---|---|---|
| 2005/0123152 A1* | 6/2005 | Magrath | H03G 7/007 381/104 |
| 2005/0175194 A1 | 8/2005 | Anderson | |
| 2007/0291959 A1* | 12/2007 | Seefeldt | H03G 3/32 381/104 |
| 2009/0116664 A1* | 5/2009 | Smirnov | H04R 3/00 381/106 |

OTHER PUBLICATIONS

McNally, G.W., et al., "Dynamic Range Control of Digital Audio Signals," BBC Research Department, Journal Audio Eng. Soc., vol. 32, No. 5, May 1984, 12 pages.

Cassidy, R., "Level Detection Tunings and Techniques for the Dynamic Range Compression of Audio Signals," Audio Engineering Society, Convention Paper 6235, Oct. 28-31, 2004, 12 pages.

Abel, J., et al., "On Peak-Detecting and RMS Feedback and Feedforward Compressors," Audio Engineering Society, Convention Paper 5914, Oct. 10-13, 2003, 7 pages.

Hamalainen, P., "Smoothing of the Control Signal without clipped output in Digital Peak Limiters," Proceedings of the 5th International Conference on Digital Audio Effects (DAFx02), Sep. 26-28, 2002, 4 pages.

Foreign Communication From a Counterpart Application, PCT Application No. PCT/EP2014/051795, International Search Report dated Oct. 27, 2014, 4 pages.

Foreign Communication From a Counterpart Application, PCT Application No. PCT/EP2014/051795, Written Opinion dated Oct. 27, 2014, 6 pages.

Foreign Communication From a Counterpart Application, Chinese Application No. 201480055179.9, Chinese Search Report dated Jul. 21, 2017, 3 pages.

Foreign Communication From a Counterpart Application, Chinese Application No. 201480055179.9, Chinese Office Action dated Jul. 31, 2017, 8 pages.

* cited by examiner

DIGITAL COMPRESSOR FOR COMPRESSING AN AUDIO SIGNAL

CROSS-REFERENCE TO RELATED APPLICATIONS

This application is a continuation of International Application No. PCT/EP2014/051795, filed on Jan. 30, 2014, which is hereby incorporated by reference in its entirety.

TECHNICAL FIELD

The disclosure relates to the field of audio signal processing.

BACKGROUND OF THE DISCLOSURE

The reduction of the dynamic range of an audio signal is an important topic in the fields of sound recording, sound reproduction and broadcasting. The reduction of the dynamic range can be relevant for adapting the characteristics of the audio signal on the physical capabilities of the employed audio equipment.

For reducing the dynamic range of an audio signal, compressors can be employed. The compression characteristic of a compressor can be controlled by a plurality of compression parameters which can significantly influence the perceived quality of the audio signal.

The adjustment of the parameters of a compressor is typically performed manually by experienced users. There exists no intuitive mechanism for controlling the compression of an audio signal while concurrently maintaining a high perceived quality of the audio signal.

In G. W. McNally, "Dynamic Range Control of Digital Audio Signals", Journal of the Audio Engineering Society, vol. 32, pp. 316-327, 1984, dynamic range compression using compressors is described.

SUMMARY OF THE DISCLOSURE

It is the object of the disclosure to provide a digital compressor for compressing an input audio signal with an efficient mechanism for controlling the compression of the input audio signal.

This object is achieved by the features of the independent claims. Further implementation forms are apparent from the dependent claims, the description and the figures.

The disclosure is based on the finding that a plurality of compression parameters for the compression of the input audio signal can be derived from a single compression gain parameter. The plurality of compression parameters can be derived such that a high perceived quality of the compressed audio signal can be achieved. The compression gain parameter can continuously be chosen and can result in different degrees of compression of the input audio signal. Therefore, an intuitive mechanism for controlling the compression of the input audio signal can be provided.

According to a first aspect, the disclosure relates to a digital compressor for compressing an input audio signal, the digital compressor comprising a compression gain control for providing a compression gain parameter, a compression parameter determiner for determining a compression ratio from the compression gain parameter, the compression parameter determiner being configured to weight the compression gain parameter by a predetermined weight factor to obtain the compression ratio, an auxiliary signal generator for manipulating the input audio signal in dependence of the compression ratio to obtain a first auxiliary signal, and a combiner unit for combining the first auxiliary signal with the compression gain parameter to obtain a second auxiliary signal, and for combining the input audio signal with the second auxiliary signal to obtain the compressed audio signal. Thus, a digital compressor which can be controlled by a single compression gain parameter can be provided.

The input audio signal can be a sampled and/or quantized audio signal. The input audio signal can comprise a mono audio signal, a stereo audio signal, or a multi-channel audio signal.

The compression gain control can comprise a sliding control for providing the compression gain parameter. The compression gain parameter can be provided in a logarithmic scale, e.g. 0 decibels (dB), 3 dB, 6 dB, or 12 dB.

The compression parameter determiner can determine the compression ratio from the compression gain parameter by weighting the compression gain parameter by a predetermined weight factor. The compression ratio can be provided in a linear scale, e.g. 1, 2, 5, or 10. The predetermined weight factor can be provided in a logarithmic scale, e.g. 2 dB, or in a linear scale, e.g. 1.5.

The auxiliary signal generator can manipulate the input audio signal in dependence of the compression ratio to obtain the first auxiliary signal. The manipulation can relate to a derivation of the first auxiliary signal from the input audio signal or to a processing of the input audio signal to obtain the first auxiliary signal. The first auxiliary signal can be a time-dependent real-valued signal.

The combiner unit can combine the first auxiliary signal with the compression gain parameter to obtain a second auxiliary signal. The combiner unit can further combine the input audio signal with the second auxiliary signal to obtain the compressed audio signal. The second auxiliary signal can be a time-dependent real-valued signal.

The compressed audio signal can be a sampled and/or quantized audio signal. The compressed audio signal can comprise a mono audio signal, a stereo audio signal, or a multi-channel audio signal. The dynamic range of the compressed audio signal can be reduced with regard to the dynamic range of the input audio signal.

In a first implementation form of the digital compressor according to the first aspect as such, the compression parameter determiner is configured to determine the compression ratio according to the following equation:

$$R = G/K, \text{ or } R \approx G/K$$

wherein G denotes the compression gain parameter, K denotes the predetermined weight factor, and R denotes the compression ratio. Thus, the compression ratio can be determined efficiently.

The predetermined weight factor can be chosen within a logarithmic range e.g. from 1.5 dB to 3 dB, or within a linear range from e.g. 1.4 to 2. The compression ratio can deviate from the determined value of the equation within a predetermined deviation range, e.g. ±10%.

In a second implementation form of the digital compressor according to the first aspect as such or the first implementation form of the first aspect, the compression parameter determiner is further configured to determine an attack filtering time constant from the compression gain parameter according to the following equation:

$$\tau_A = A_1 \cdot G + A_2$$

wherein G denotes the compression gain parameter in a logarithmic scale, $A_1$ denotes a first predetermined attack constant, $A_2$ denotes a second predetermined attack constant, and $\tau_A$ denotes the attack filtering time constant, and wherein the auxiliary signal generator is configured to filter the input audio signal in dependence of the attack filtering time constant to obtain the first auxiliary signal. Thus, an attack filtering time constant can be determined efficiently.

The attack filtering time constant can define a filtering characteristic for filtering the input audio signal within an attack phase. The attack phase can relate to a time interval with increasing amplitude of the input audio signal.

The first predetermined attack constant can be a slope relating to an increase or decrease of the attack filtering time constant in dependence of the compression gain parameter. The first predetermined attack constant can e.g. be −0.0002 sec/dB. The second predetermined attack constant can be an offset relating to the attack filtering time constant. The second predetermined attack constant can e.g. be 0.006 sec.

In a third implementation form of the digital compressor according to the first aspect as such or any preceding implementation form of the first aspect, the compression parameter determiner is further configured to determine a release filtering time constant from the compression gain parameter according to the following equation:

$$\tau_R = B_1 \cdot G + B_2$$

wherein G denotes the compression gain parameter in a logarithmic scale, $B_1$ denotes a first predetermined release constant, $B_2$ denotes a second predetermined release constant, and $\tau_R$ denotes the release filtering time constant, and wherein the auxiliary signal generator is configured to filter the input audio signal in dependence of the release filtering time constant to obtain the first auxiliary signal. Thus, a release filtering time constant can be determined efficiently.

The release filtering time constant can define a filtering characteristic for filtering the input audio signal within a release phase. The release phase can relate to a time interval with decreasing amplitude of the input audio signal.

The first predetermined release constant can be a slope relating to an increase or decrease of the release filtering time constant in dependence of the compression gain parameter. The first predetermined release constant can e.g. be −0.0033 sec/dB. The second predetermined release constant can be an offset relating to the release filtering time constant. The second predetermined release constant can e.g. be 0.12 sec.

In a fourth implementation form of the digital compressor according to the first aspect as such or any preceding implementation form of the first aspect, the compression parameter determiner is further configured to determine a compression threshold from the compression gain parameter according to the following equation:

$$T = P_{max} - G \cdot \lambda(1 + 1/R)$$

wherein G denotes the compression gain parameter in a logarithmic scale, $\lambda$ denotes a tolerance factor, R denotes the compression ratio, $P_{max}$ denotes a maximum magnitude of the input audio signal in a logarithmic scale, and T denotes the compression threshold in a logarithmic scale, and wherein the auxiliary signal generator is configured to compare the input audio signal with the compression threshold to obtain the first auxiliary signal. Thus, a compression threshold can be determined efficiently.

The compression threshold can define a threshold for compressing the input audio signal. A compression of the input audio signal can be performed for magnitudes or amplitudes of the input audio signal exceeding the compression threshold. The compression threshold can e.g. be −15 dB.

The tolerance factor can introduce a dependency of the compression threshold from the attack filtering time constant. The tolerance factor can e.g. be determined according to $\lambda = 1.122 + 65.1/\text{sec} \cdot \tau_A$, wherein $\tau_A$ denotes the attack filtering time constant. The tolerance factor can be a real number, e.g. 1.2 or 1.5.

The maximum magnitude of the input audio signal can be determined by the compression parameter determiner.

In a fifth implementation form of the digital compressor according to the first aspect as such or any preceding implementation form of the first aspect, the auxiliary signal generator is configured to filter the input audio signal by a digital filter, the digital filter comprising a frequency transfer function having a magnitude over frequency, the magnitude being formed by an equal loudness curve of a human ear. Thus, the compression of the input audio signal can primarily be performed in portions of the input audio signal, where the human ear is less sensitive.

The equal loudness curve of the human ear can relate to a sound pressure curve over frequency for which a human perceives a constant loudness using pure and/or steady tones. The equal loudness curve of the human ear can be an equal loudness curve according to ISO 226:2003.

In a sixth implementation form of the digital compressor according to the first aspect as such or any preceding implementation form of the first aspect, the auxiliary signal generator is configured to filter the input audio signal by a digital low-pass filter, the digital low-pass filter comprising a filter step response in time domain. Thus, the input audio signal can be smoothed and compression artifacts can be reduced.

The filter step response can comprise different time constants for increasing magnitudes of the input audio signal and decreasing magnitudes of the input audio signal. A rise time of the filter step response can be determined by an attack filtering time constant. A fall time of the filter step response can be determined by a release filtering time constant.

In a seventh implementation form of the digital compressor according to the sixth implementation form of the first aspect, the digital low-pass filter is configured to filter the input audio signal according to the following equations:

$$P_s(t) = \begin{cases} \alpha_A P_s(t-1) + (1 - \alpha_A) P_x(t), & P_x(t) > P_s(t-1) \\ \alpha_R = P_s(t-1), & P_x(t) \leq P_s(t-1) \end{cases}$$

and $$\alpha_R = e^{-1/\tau_R}, \alpha_A = e^{-1/\tau_A}$$

wherein $\tau_A$ denotes the attack filtering time constant, $\tau_R$ denotes the release filtering time constant, $\alpha_A$ denotes an exponential attack constant, $\alpha_R$ denotes an exponential release constant, t denotes a sampling time index, $P_X$ denotes a magnitude of the input audio signal in a logarithmic scale, and $P_S$ denotes a magnitude of the filtered audio signal in a logarithmic scale. Thus, the digital low-pass filter can be implemented efficiently.

The exponential attack constant can be determined from a unit-less or normalized attack filtering time constant. The exponential release constant can be determined from a unit-less or normalized release filtering time constant. The sampling time index can indicate a sampling time of the input audio signal. The sampling time index can be a natural number, e.g. 2 or 128.

The digital low-pass filter can relate to a first-order digital low-pass filter. The digital low-pass filter can be a one-pole recursive infinite impulse response (IIR) filter.

In an eighth implementation form of the digital compressor according to the first aspect as such or any preceding implementation form of the first aspect, the auxiliary signal generator is configured to determine a magnitude of the first auxiliary signal according to the following equation:

$$g(t) = \begin{cases} -(1 - 1/R) \cdot (P_s(t) - T), & P_s(t) > T \\ 0, & P_s(t) \le T \end{cases}$$

wherein R denotes the compression ratio, T denotes a compression threshold in a logarithmic scale, $P_S$ denotes a magnitude of the input audio signal in a logarithmic scale, t denotes time, and g(t) denotes a magnitude of the first auxiliary signal in a logarithmic scale. Thus, the magnitude of the first auxiliary signal can be determined efficiently.

The magnitude of the first auxiliary signal can be determined according to a piecewise linear compression characteristic of the digital compressor. The compression threshold can be the corner level of the piecewise linear compression characteristic.

In a ninth implementation form of the digital compressor according to the first aspect as such or any preceding implementation form of the first aspect, the combiner unit is configured to multiply the first auxiliary signal by the compression gain parameter to obtain the second auxiliary signal. Thus, a compression headroom induced by the audio signal compression can be compensated.

The multiplication can be performed in case of a linear scale of the first auxiliary signal and of the compression gain parameter to obtain the second auxiliary signal in a linear scale. Further, an addition can be performed in case of a logarithmic scale of the first auxiliary signal and of the compression gain parameter to obtain the second auxiliary signal in a logarithmic scale.

In a tenth implementation form of the digital compressor according to the first aspect as such or any preceding implementation form of the first aspect, the combiner unit is configured to multiply the input audio signal by the second auxiliary signal to obtain the compressed audio signal. Thus, a compression of the input audio signal can be performed efficiently.

The multiplication can be performed in case of a linear scale of the input audio signal and of the second auxiliary signal to obtain the compressed audio signal in a linear scale. Further, an addition can be performed in case of a logarithmic scale of the input audio signal and of the second auxiliary signal to obtain the compressed audio signal in a logarithmic scale.

In an eleventh implementation form of the digital compressor according to the first aspect as such or any preceding implementation form of the first aspect, the digital compressor further comprises an equalization filter for filtering the compressed audio signal, the equalization filter comprising a frequency transfer function having a magnitude over frequency, the magnitude being formed by an equal loudness curve of a human ear. Thus, a flat frequency response of the digital compressor can be achieved.

The equal loudness curve of the human ear can relate to a sound pressure curve over frequency for which a human perceives a constant loudness using pure and/or steady tones. The equal loudness curve of the human ear can be an equal loudness curve according to ISO 226:2003.

In a twelfth implementation form of the digital compressor according to the first aspect as such or any preceding implementation form of the first aspect, the digital compressor further comprises a peak limiter for reducing a maximum magnitude of the compressed audio signal in time domain. Thus, clipping effects of the compressed audio signal can be mitigated.

The peak limiter can be realized as a dynamic range compressor with a high compression threshold and/or a high compression ratio.

According to a second aspect, the disclosure relates to a digital compressing method for compressing an input audio signal, the digital compressing method comprising providing a compression gain parameter, determining a compression ratio from the compression gain parameter by weighting the compression gain parameter by a predetermined weight factor to obtain the compression ratio, manipulating the input audio signal in dependence of the compression ratio to obtain a first auxiliary signal, combining the first auxiliary signal with the compression gain parameter to obtain a second auxiliary signal, and combining the input audio signal with the second auxiliary signal to obtain the compressed audio signal. Thus, a digital compressing method using a single compression gain parameter can be provided.

The digital compressing method can be performed by the digital compressor according to the first aspect as such or any implementation form of the first aspect. Further features of the digital compressing method can directly result from the functionality of the digital compressor according to the first aspect as such or any implementation form of the first aspect.

According to a third aspect, the disclosure relates to a computer program comprising a program code for performing the digital compressing method according to the second aspect as such when executed on a computer. Thus, the digital compressing method can be applied in an automatic and repeatable manner.

The computer program can be provided in form of a machine-readable program code. The program code can comprise a series of commands for a processor of the computer. The processor of the computer can be configured to execute the program code.

The disclosure can be implemented in hardware and/or software.

BRIEF DESCRIPTION OF DRAWINGS

To describe the technical solutions in the embodiments of the present disclosure more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DETAILED DESCRIPTION OF EMBODIMENTS

Figure 1:
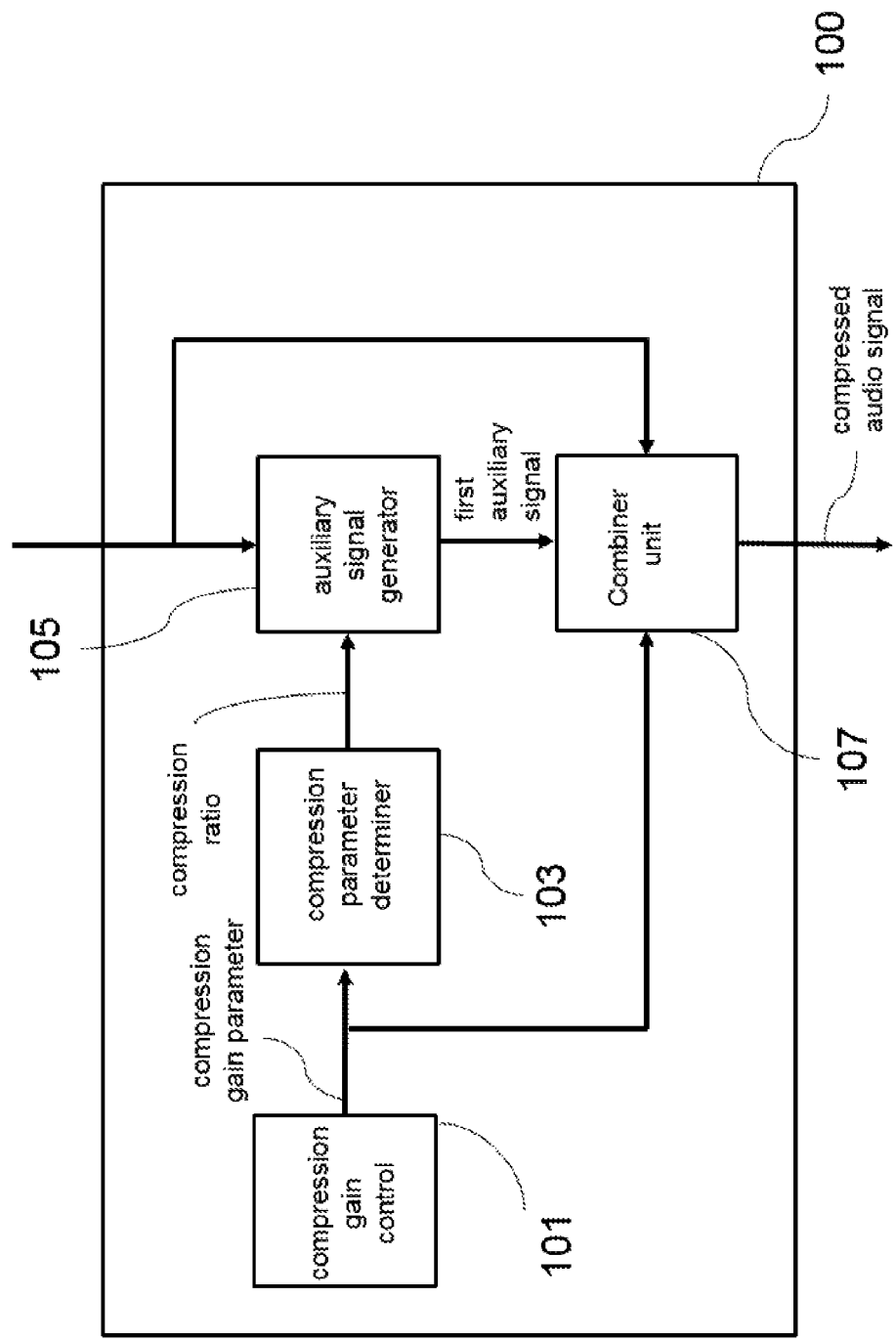
FIG. 1 shows a diagram of a digital compressor for compressing an input audio signal according to an implementation form.

FIG. 1 shows a diagram of a digital compressor 100 for compressing an input audio signal according to an implementation form.

The digital compressor 100 comprises a compression gain control 101 for providing a compression gain parameter, a compression parameter determiner 103 for determining a compression ratio from the compression gain parameter, the compression parameter determiner 103 being configured to weight the compression gain parameter by a predetermined weight factor to obtain the compression ratio, an auxiliary signal generator 105 for manipulating the input audio signal in dependence of the compression ratio to obtain a first auxiliary signal, and a combiner unit 107 for combining the first auxiliary signal with the compression gain parameter to obtain a second auxiliary signal, and for combining the input audio signal with the second auxiliary signal to obtain the compressed audio signal.

The input audio signal can be a sampled and/or quantized audio signal. The input audio signal can comprise a mono audio signal, a stereo audio signal, or a multi-channel audio signal.

The compression gain control 101 can comprise a sliding control for providing the compression gain parameter. The compression gain parameter can be provided in a logarithmic scale, e.g. 0 dB, 3 dB, 6 dB, or 12 dB.

The compression parameter determiner 103 can determine the compression ratio from the compression gain parameter by weighting the compression gain parameter by a predetermined weight factor. The compression ratio can be provided in a linear scale, e.g. 1, 2, 5, or 10. The predetermined weight factor can be provided in a logarithmic scale, e.g. 2 dB, or in a linear scale, e.g. 1.5.

The auxiliary signal generator 105 can manipulate the input audio signal in dependence of the compression ratio to obtain the first auxiliary signal. The manipulation can relate to a derivation of the first auxiliary signal from the input audio signal or to a processing of the input audio signal to obtain the first auxiliary signal. The first auxiliary signal can be a time-dependent real-valued signal.

The combiner unit 107 can combine the first auxiliary signal with the compression gain parameter to obtain a second auxiliary signal. The combiner unit 107 can further combine the input audio signal with the second auxiliary signal to obtain the compressed audio signal. The second auxiliary signal can be a time-dependent real-valued signal.

The compressed audio signal can be a sampled and/or quantized audio signal. The compressed audio signal can comprise a mono audio signal, a stereo audio signal, or a multi-channel audio signal. The dynamic range of the compressed audio signal can be reduced with regard to the dynamic range of the input audio signal.

Figure 2:
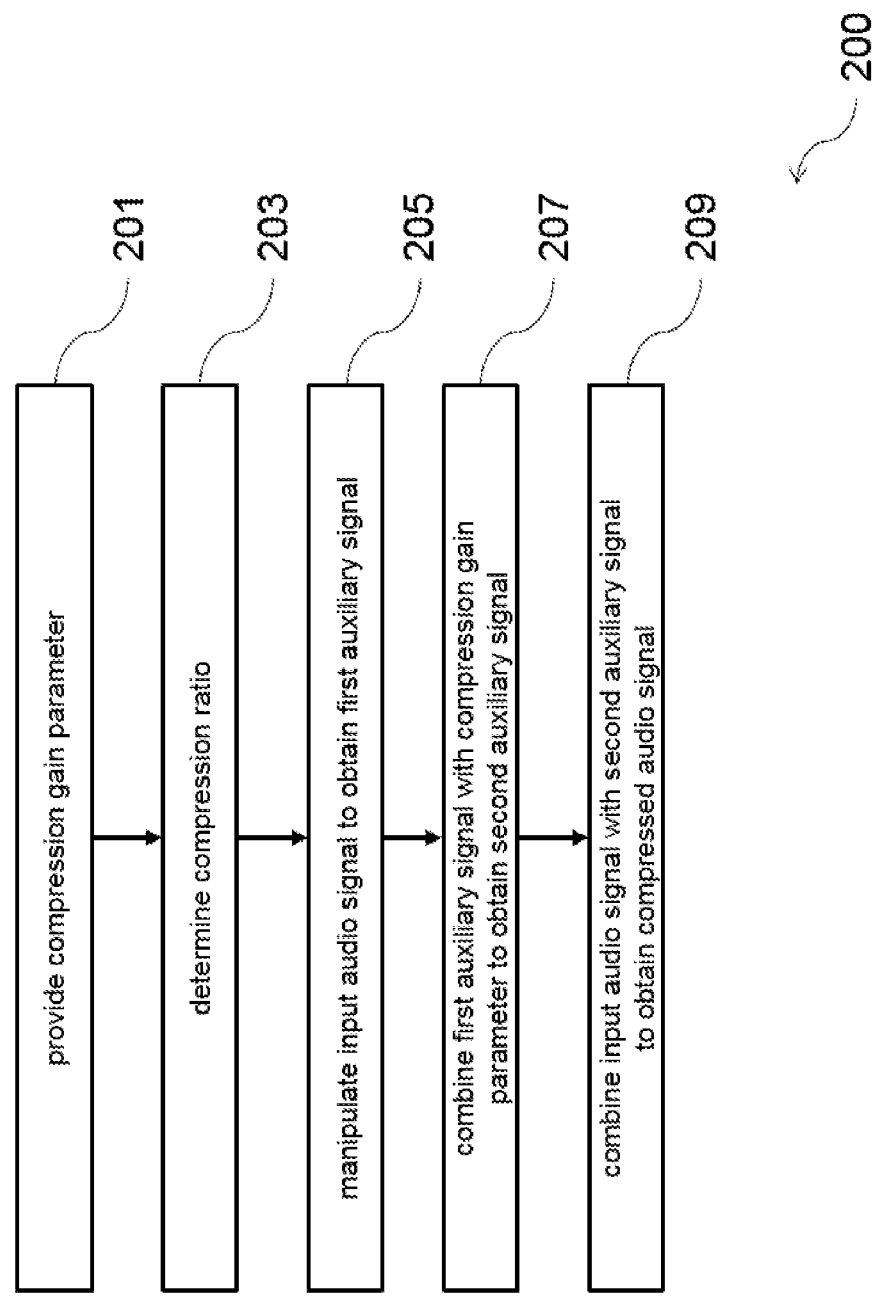
FIG. 2 shows a diagram of a digital compressing method for compressing an input audio signal according to an implementation form.

FIG. 2 shows a diagram of a digital compressing method 200 for compressing an input audio signal according to an implementation form.

The digital compressing method 200 comprises providing 201 a compression gain parameter, determining 203 a compression ratio from the compression gain parameter by weighting the compression gain parameter by a predetermined weight factor to obtain the compression ratio, manipulating 205 the input audio signal in dependence of the compression ratio to obtain a first auxiliary signal, combining 207 the first auxiliary signal with the compression gain parameter to obtain a second auxiliary signal, and combining 209 the input audio signal with the second auxiliary signal to obtain the compressed audio signal.

The digital compressing method 200 can be performed by the digital compressor 100 in FIG. 1. Further features of the digital compressing method 200 can directly result from the functionality of the digital compressor 100 in FIG. 1.

Figure 3:
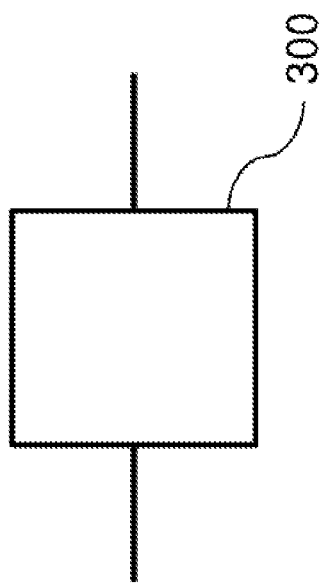
FIG. 3 shows a diagram of a digital filter for filtering the input audio signal according to an implementation form.

FIG. 3 shows a diagram of a digital filter 300 for filtering the input audio signal according to an implementation form.

The auxiliary signal generator can be configured to filter the input audio signal by the digital filter 300, the digital filter 300 comprising a frequency transfer function having a magnitude over frequency, the magnitude being formed by an equal loudness curve of a human ear.

The equal loudness curve of the human ear can relate to a sound pressure curve over frequency for which a human perceives a constant loudness using pure and/or steady tones. The equal loudness curve of the human ear can be an equal loudness curve according to ISO 226:2003.

Figure 4:
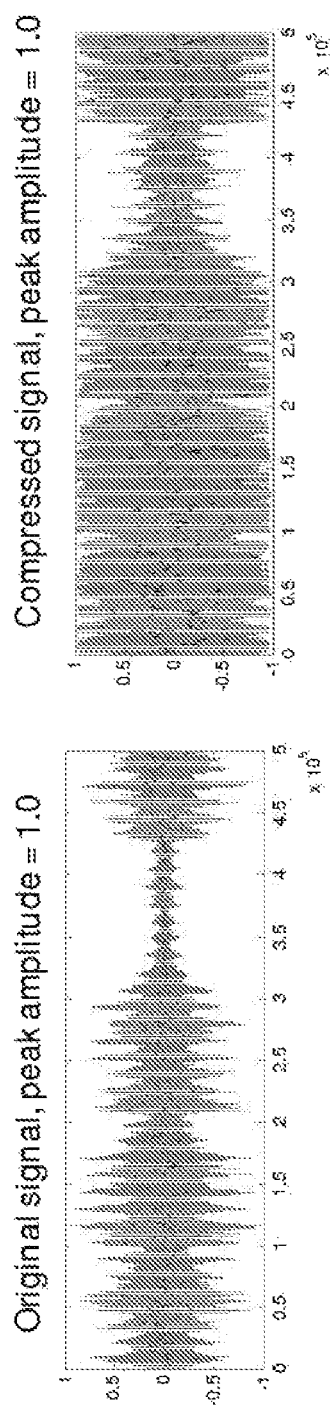
FIG. 4 shows a diagram of a high dynamic range audio signal and a compressed audio signal according to an implementation form.

FIG. 4 shows a diagram of a high dynamic range audio signal and a compressed audio signal according to an implementation form. At the left, the original high dynamic range audio signal with peak amplitude of 1 is depicted. At the right, the compressed audio signal with peak amplitude of 1, but reduced dynamic range, is depicted.

Mobile devices such as tablets or smartphones are typically equipped with small, low quality micro-speakers and low-power amplifiers. As a result, the quality of the sound which can be reproduced by the electro-acoustic system in such devices can be limited. In particular, the maximum sound pressure level which can be produced can be limited. This can result in signal distortions at higher levels and a limited dynamic range.

Furthermore, such devices are often used to play sound in noisy environments which can demand for high output levels. Even more, further processing, such as stereo widening in order to compensate for the small distance between the speakers can reduce the maximum output level even further.

One solution to this problem can be an integration of speakers of higher quality and amplifiers with higher output power. However, this can demand for larger speakers which may not be integrated into small mobile devices and amplifiers consuming more energy from the battery. Therefore, there may be a demand for signal processing techniques which are able to enhance the perceived loudness of the acoustic signals produced by such mobile devices. Dynamic range compression (DRC) of audio signals can be one technique for loudness enhancement. The goal of DRC can be to increase the mean signal energy while keeping the peak energy within the limits imposed by the capabilities of the electro-acoustic system. To achieve this effect, one strategy can be to enhance the level of weak signal components.

The effect of a dynamic range compression of an audio signal is illustrated in FIG. 4. The left diagram shows signal amplitudes of a typical music example. The regularly occurring high amplitude peaks typically correspond to drum hits. The signal can be normalized to obtain a peak amplitude of 1 which may correspond to the maximum amplitude which can be handled by the electro-acoustic system. The amplitudes of digital audio signals are typically constrained to the interval [−1;1]. Amplitudes exceeding these limits can result in clipping, i.e. they can be limited to the limits. This can cause high signal distortion. This peak amplitude can restrict the overall output level of the signal since it can occur only rarely in the high dynamic range audio signal. Most parts of the signal can have low amplitude. The result of a dynamic range compression operation performed on this signal can result in the amplitude plot on the right of FIG. 4. While the peak amplitude of the resulting signal can still be 1, the mean amplitude which defines the perceived average loudness can be much higher. In particular, components with low amplitude can be significantly enhanced. The dynamic range which can be defined as the ratio of low to high energy components can be reduced.

Figure 5:
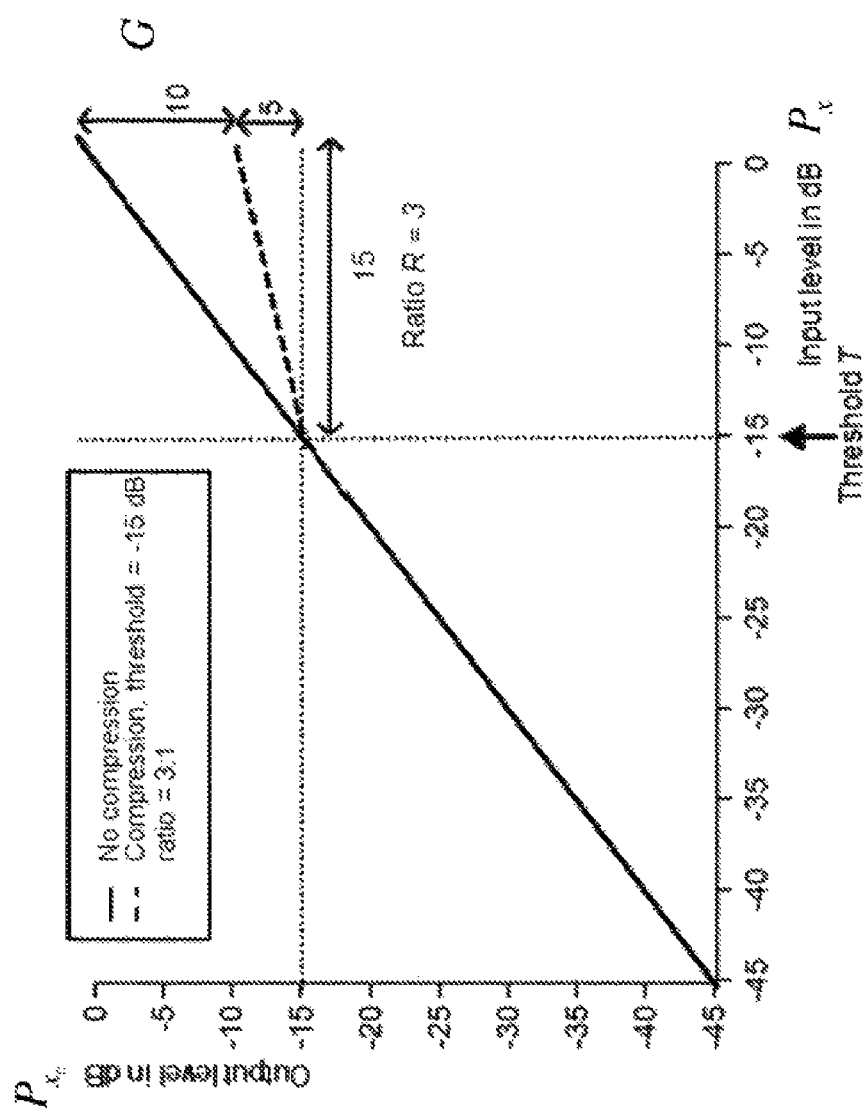
FIG. 5 shows a diagram of a dynamic range compression principle according to an implementation form.

FIG. 5 shows a diagram of a dynamic range compression principle according to an exemplary implementation form. The basic principle of dynamic range compression using a static compression curve based on peak amplitude detection is illustrated. The case of no compression is illustrated by the solid line. The case of compression using a compression threshold of −15 dB and a compression ratio of 3:1 is illustrated by the dashed line.

The transfer function between the input signal x and the compressed signal $x_c$ shows the following behavior. In case the level of the input signal x is below a given threshold T specified in dB, it is not modified; the compressed signal $x_c$ is identical to x. In case the level of the input signal x exceeds the threshold T, $x_c$ is reduced by a given compression ratio R. The compression ratio relates levels or level changes of the input signal to levels or level changes of the output signal. In this example, a compression ratio of R=3 indicates that a level exceeding the threshold T by 3 dB in the input signal is reduced to a level of only 1 dB above the threshold in the output signal. As a result, the level $P_{x_c}$ of the compressed signal is reduced, compared to the level Px of the input signal, according to the time variant gain g(t).

Eqn. 1 can be given as follows:

$$P_x(t) = 20\log_{10}|x(t)|$$

$$g(t) = \begin{cases} -(1-1/R) \cdot (P_x(t) - T), & P_x(t) > T \\ 0, & P_x(t) \le T \end{cases}$$

$$P_{x_c}(t) = P_x(t) + g(t)$$

This can be the basic principle of dynamic range compression. As DRC can be an important topic in music recording and production, even in the analogue domain, many different implementations and extensions can be applied. In particular, the piecewise linear compression curve shown in FIG. 5 may be replaced by a soft compression curve, e.g., with a knee, or a saturating compression curve such as a sigmoid.

Figure 6:
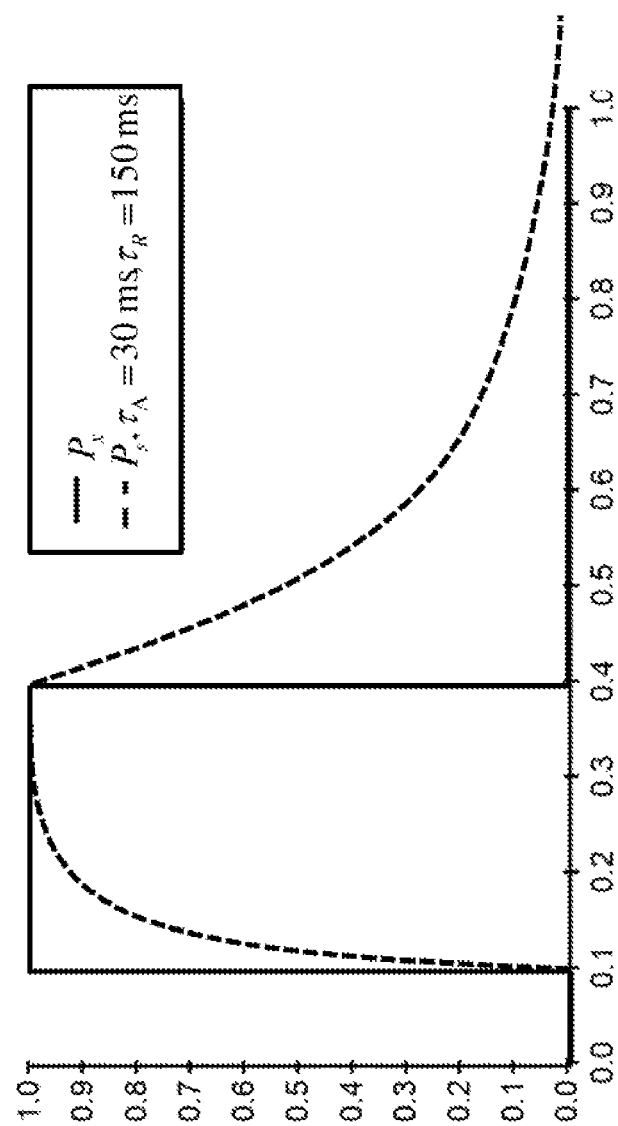
FIG. 6 shows a diagram of temporal smoothing using exponential decays according to an implementation form.

FIG. 6 shows a diagram of temporal smoothing using exponential decays according to an implementation form. The temporal smoothing using exponential decays can be employed for modeling attack and/or decay times. The solid line illustrates Px. The dashed line illustrates Ps using an attack filtering time constant of 30 ms and a release filtering time constant of 150 ms.

Without temporal smoothing, the dynamic range compression can introduce many artifacts because the level of the output signal can change too quickly. The output signal may not resemble the characteristics of the input signal. In order to reduce the audible artifacts of the DRC, the compression gain can be changing slowly.

An approach to achieve this effect can be to smooth the detection of the peak amplitude by adding exponential decays for attack and release times as illustrated in FIG. 6. Specifying different time constants $\tau_A$, $\tau_R$ for attack, index A, and release, index R, can allow for controlling the smoothing effect on different states of an acoustic event. Attack can refer to the start of an event going along with an increase in signal level. Release can refer to the energy decay of this event which is typically slower. The exponential decays for attack and release can be computed as follows:

$\tau_A$, $\tau_R$ can be defined as times to reach 63% of a final value for attack and release;

$$\alpha_R = e^{-1/\tau_R} \text{ and } \alpha_A = e^{-1/\tau_A}.$$

Eqn. 2 can be given as follows:

$$P_s(t) = \begin{cases} \alpha_A P_s(t-1) + (1-\alpha_A)P_x(t), & P_x(t) > P_s(t-1) \\ \alpha_R P_s(t-1), & P_x(t) \le P_s(t-1) \end{cases}$$

Then, can $P_s(t)$ can be used in Eqn. 1 or 2 for the computation of the time-variant gain g(t) replacing $P_x(t)$.

Different implementations can be used, e.g., decoupled, branching, feed-forward, feedback, side-chain, biased, and/or post gain implementations.

The temporal smoothing parameter settings can be relevant and can constitute a trade-off between the amount of compression and the audio quality, i.e. artifacts. In particular, they can affect how amplitude peaks as resulting from drums or transients can be affected. In case of a long release time constant, after a peak or transient, the signal can be attenuated for a long time, and Py can be reduced too much. In case of a short release time constant, a jump in signal level after a transient can occur. In case of a long attack time constant, transients may not be attenuated as they may be shorter than the attack time, and the peak level can still be high. In case of a short attack time constant, transients can be squashed resulting in a lack of clarity, the level can be reduced too much, and the level of the transients can be the same as the level of the signal right before the transient.

Different solutions can be applied for DRC. The four main criteria to rate DRC algorithms can be sound quality, compression rate, computational complexity, and user controllability. There can be a trade-off between compression and quality as high compression can typically result in poor sound quality. Peaks in the waveform, e.g. transients or attacks, can be attenuated to obtain a high compression gain. This can result in a lack of perceptual clarity. High quality dynamic range compression systems as used for example in TV and radio broadcasting can typically work in frequency domain or on a sub-band decomposition of the full-band signal. This can result in a high computational complexity. In particular for mobile devices, computational and energy resources can be limited.

Parameter settings can be relevant for obtaining a high amount of compression while retaining a high audio quality. Optimal parameter settings can also depend on the specific audio signal and the listening environment. For applications in consumer devices, parameters can typically be predefined using a conservative or less optimal setting. The user may not have any control mechanism except for on or off.

Figure 7:
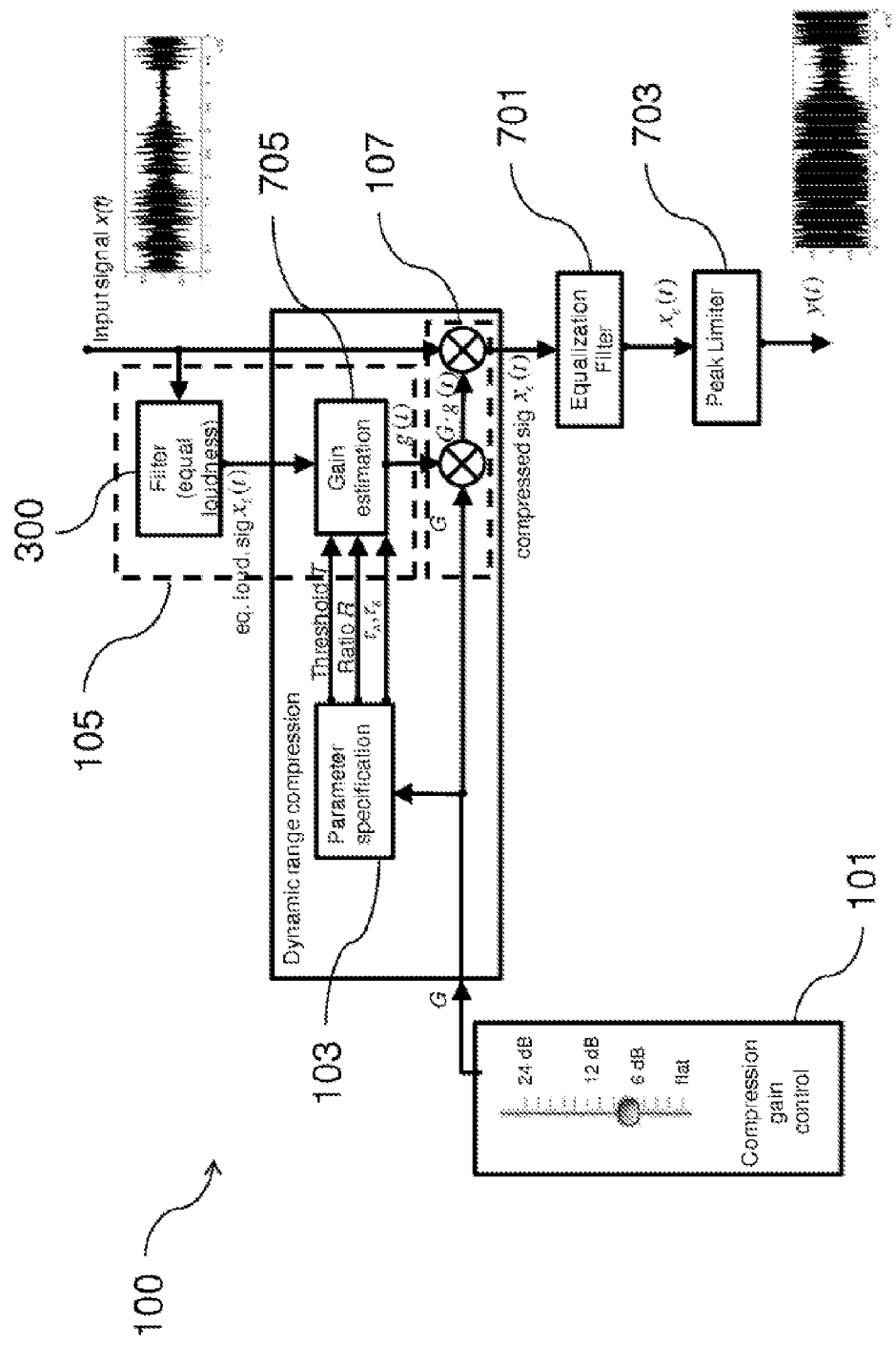
FIG. 7 shows a diagram of a digital compressor for compressing an input audio signal according to an implementation form.

FIG. 7 shows a diagram of a digital compressor 100 for compressing an input audio signal according to an implementation form. The digital compressor 100 can comprise a dynamic range compression system.

The digital compressor 100 comprises a compression gain control 101, a compression parameter determiner 103, an auxiliary signal generator 105, a combiner unit 107, an equalization filter 701, and a peak limiter 703. The compression parameter determiner 103 can be used for parameter specification. The compression parameter determiner 103 can provide a compression threshold, a compression ratio, an attack filtering time constant, and a release filtering time constant to the auxiliary signal generator 105. The auxiliary signal generator 105 can comprise a digital filter 300, and a gain estimation unit 705.

Many approaches focus on music production applications. The embodiments of the disclosure particularly address mobile sound reproduction scenarios where the goal can be to increase the average output level produced by the speakers of the mobile device such as a smartphone and/or a tablet in real-time while retaining a high sound quality and low computational complexity and low power consumption or low battery power consumption.

Embodiments of the disclosure relate, for example, to an enhanced digital compressor 100 or dynamic range compression system as depicted in FIG. 7. The digital compressor 100 or system can comprise a model of human sound perception to consider the frequency characteristic of the sensitivity of the human ear, i.e. a filter equal loudness module. The digital compressor 100 or system can comprise a cascaded dynamic range compression system to reduce the level of transients while retaining signal clarity, i.e. a dynamic range compression module cascaded with a peak limiter module. The digital compressor 100 or system can comprise a single control parameter for the compression gain G which can be controlled by the user or consumer in a continuous fashion. The digital compressor 100 or system can comprise a low-complexity full-band implementation in time-domain for real-time applications on mobile devices.

A flow-chart of the digital compressor 100 or system is depicted in FIG. 7. Given an input signal x(t), the digital compressor 100 or system can execute the following steps.

Firstly, a digital filter 300 or filter equal loudness module can be applied, i.e. a preprocessing operation applying a simplified loudness model by filtering the input signal x(t) with an equal loudness curve in order to obtain a loudness equalized input signal $x_l(t)$. The goal of the pre-processing can be to emphasize frequencies in the signal where the human ear is less sensitive. Secondly, a dynamic range compression module can be applied. It can comprise a compression parameter determiner 103 or parameter specification module. Given an externally, e.g. user specified desired compression gain in dB, the internal dynamic range compression parameters T, R, $\tau_A$, $\tau_R$ can be adjusted in an optimal manner. It can further comprise a gain estimation unit 705 or gain estimation module which can estimate the time variant gain g(t) from the loudness equalized input signal $x_l(t)$. The obtained compression can be stronger in regions which have been emphasized by the equalization which can correspond to regions where the human ear is less sensitive. As a result, artifacts of the dynamic range compression can be less audible and a stronger compression can be applied. The dynamic range compression of the input signal x(t) can be performed by applying the time variant gain g(t) and the desired compression gain G to the signal x(t) to obtain the compressed signal $x_c(t)$. Thirdly, an equalization filter 701 or an equalization module can optionally be applied which can apply an equalization to $x_c(t)$ to correct for the frequency dependent compression and recreate a flat frequency response of the signal $x_e(t)$. This can also take the frequency response of the loudspeakers into account. Fourthly, a peak limiter 703 can optionally be applied. A soft limiting of the peaks and/or transients can be applied to prevent clipping in strong attack phases to obtain the output signal y(t).

Figure 8:
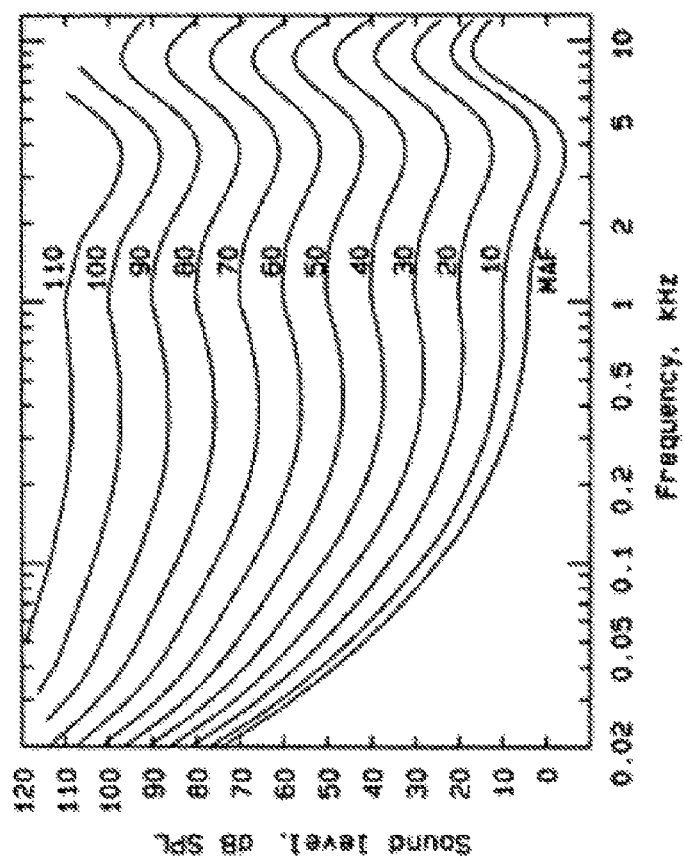
FIG. 8 shows a diagram of different equal loudness curves according to an implementation form.

FIG. 8 shows a diagram of different equal loudness curves according to an implementation form.

The ear may not be equally sensitive to all frequencies. FIG. 8 shows the response to different frequencies over the entire audible range as a set of curves showing the sound pressure levels perceived as being equally loud. For low and high frequencies, the sound pressure level can be much higher to obtain the same perceived loudness as in mid frequencies. The curves can be lowest in the range from 2 to 5 kilohertz (kHz), with a dip at 4 kHz, indicating that the ear can be most sensitive to frequencies in this range. The intensity level of higher or lower tones can be raised substantially in order to create the same impression of loudness. This finding can be exploited to achieve a higher sound quality of the output signals. The idea can be to apply stronger dynamic range compression in those frequency regions where the human ear is less sensitive.

Figure 9:
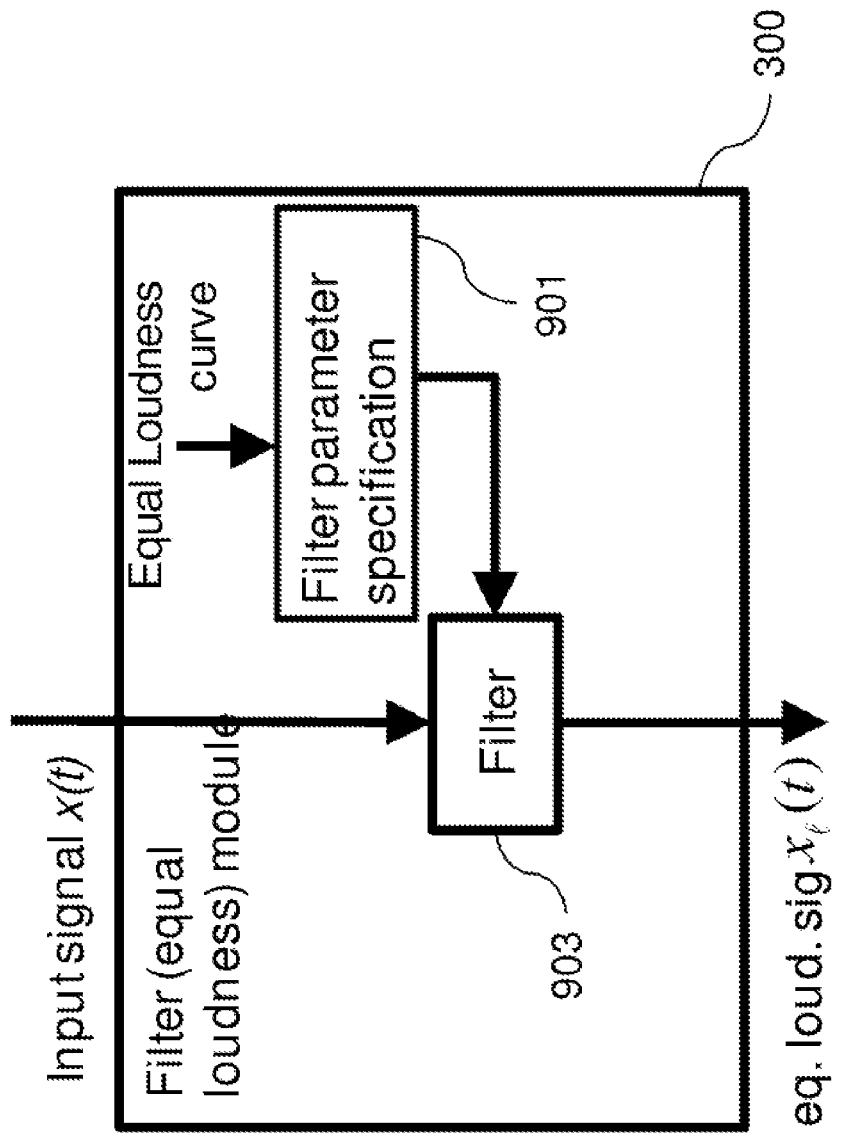
FIG. 9 shows a diagram of a digital filter for filtering an input audio signal according to an implementation form.

FIG. 9 shows a diagram of a digital filter 300 for filtering an input audio signal according to an implementation form. The digital filter 300 can comprise a filter equal loudness module.

The digital filter 300 can comprise a determining unit 901 and a filtering unit 903. The determining unit 901 can be used for filter parameter specification, wherein an equal loudness curve can be provided to the determining unit 901 to obtain filter parameters. The filtering unit 903 can filter an input signal x(t) upon the basis of the filter parameters to obtain a loudness equalized signal $x_l(t)$.

A loudness model can be applied to model the sensitivity of the human ear by filtering with an equal loudness curve. This can enhance frequencies where the human ear is less sensitive and can attenuate frequencies where the human ear is highly sensitive.

Figure 10:
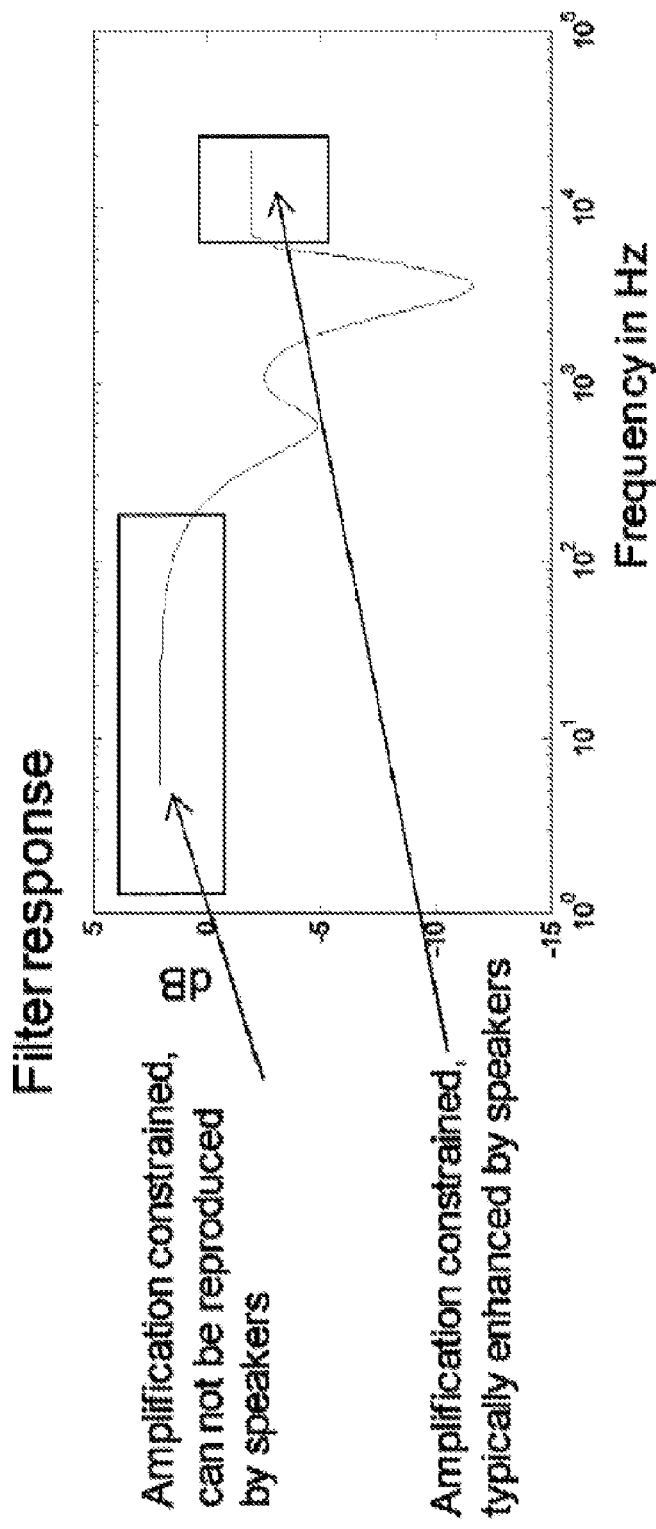
FIG. 10 shows a diagram of a frequency response of a digital filter used to model the loudness sensitivity of the human ear according to an implementation form.

FIG. 10 shows a diagram of a frequency response of a digital filter used to model the loudness sensitivity of the human ear according to an implementation form. At low frequencies, the amplification can be constrained and may not be reproduced by speakers. At high frequencies, the amplification can be constrained and is typically enhanced by speakers.

The following processing can be used to obtain this effect, see FIG. 9. Perform a filtering with a filter response which resembles the equal loudness curve. This can enhance the level at frequencies where the human ear is less sensitive and can attenuate frequencies where the human ear is highly sensitive. Then, the subsequent dynamic range compression can be concentrated in frequency regions where the human ear is less sensitive, i.e. high and low frequencies. As a result, compression artifacts can be less audible. In particular, the frequency range 2-5 kHz or 2-6 kHz can hardly be modified by the dynamic range compression. This range can be most important for sound clarity.

The filter response as shown in FIG. 10 can be based on equal loudness curves but modified according to several aspects. To consider micro-speaker characteristics and capabilities, the amplification of lowest and highest frequencies can be limited by introducing an upper limit. The motivation for this limit can be based on the considered application scenario using small speakers. Here, lowest frequencies may not be reproduced by the speakers and high frequencies can typically be amplified by such speakers. Limiting the amplifications can take this into account. The overall range, i.e. difference between minimum and maximum of the filter response, of the amplification can be restricted to just span 15 dB. From FIG. 8 it can be seen that the differences between minimum and maximum values in sound pressure levels of a single equal loudness curve can reach up to 80 dB. In the dynamic range compression, the threshold T can, in typical applications scenarios, be set to values between 6 and 20 dB. As a result, applying a equalization which can amplify certain frequencies by 80 dB compared to others can result in only these frequencies being highly compressed, other, however, may not reach the threshold and may therefore be not compressed at all. Constraining the overall range of amplification can allow to control the strength of the dynamic range compression in different frequency regions.

Figure 11:
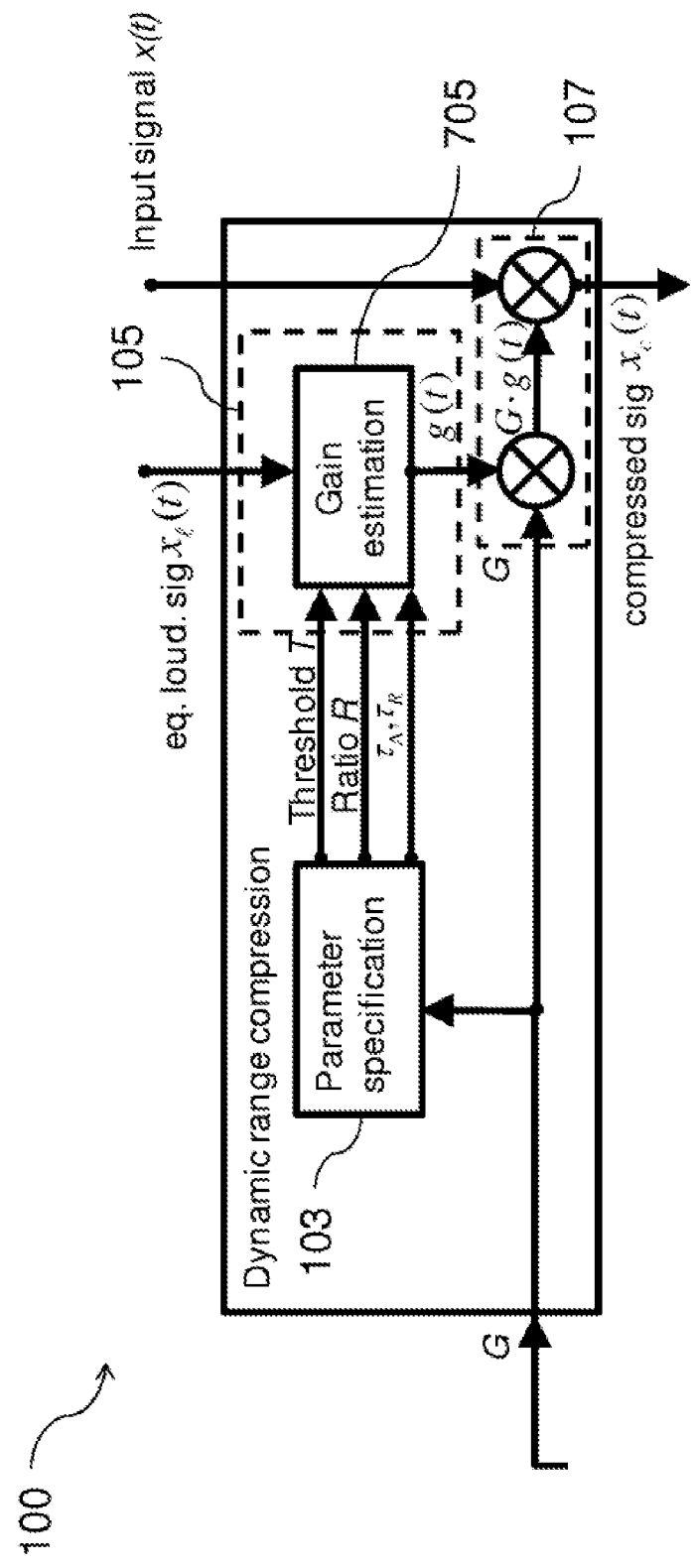
FIG. 11 shows a diagram of a digital compressor for compressing an input audio signal according to an implementation form.

FIG. 11 shows a diagram of a digital compressor 100 for compressing an input audio signal according to an implementation form. The digital compressor 100 can comprise a dynamic range compression module.

The digital compressor 100 comprises a compression parameter determiner 103, an auxiliary signal generator 105, and a combiner unit 107. A compression gain control of the digital compressor 100 is not depicted in FIG. 11. The compression parameter determiner 103 can be used for parameter specification. The compression parameter determiner 103 can provide a compression threshold, a compression ratio, an attack filtering time constant, and a release filtering time constant to the auxiliary signal generator 105. The auxiliary signal generator 105 can comprise a gain estimation unit 705. A loudness equalized signal $x_f(t)$ can be provided to the auxiliary signal generator 105. An input audio signal $x(t)$ can be provided to the combiner unit 107. A compressed audio signal $x_c(t)$ can be provided by the combiner unit 107.

Subsequently, the dynamic range compression can be applied to the input signal as shown in FIG. 11. The dynamic range compression can follow the general description and can use the same notation.

First, given a desired compression gain parameter G, e.g. specified by the user, parameters T, R, $\tau_A$, $\tau_R$ for the dynamic range compression as introduced can be derived as follows. The goal can be to compress the signal such that a headroom of G is created between the peak magnitude or amplitude of $x_c(t)$ and the maximum value Pmax which can be reproduced without clipping.

$$\max(P_{x_c}(t)) \stackrel{!}{=} P_{max} - G$$

$$T = P_{max} - G \cdot \lambda(1 + 1/R)$$

The finding can be that for obtaining the desired compression gain parameter G, different values for R and T are possible. Lowering the threshold can allow for obtaining a higher G, but at the same time can also increase the amount of signal components to be affected by the DRC. Increasing the compression ratio R, the components above the threshold can be stronger compressed. Selecting R and T values which are optimal in terms of perceptual quality can be a difficult task. A finding is that a certain relation between the threshold T and the compression ratio R is desirable to obtain high quality. Furthermore, extensive listening tests revealed that the perceptual quality of the dynamic range compression is optimal when it is approximately R≈G/(2 dB).

The filtering time constants or temporal smoothing constants $\tau_A$, $\tau_R$ can affect the DRC result by reducing the amount of compression to ensure temporal continuity which can be important for obtaining a high perceptual quality. As a result, the final compression which is achieved can be lower than the desired G. The stronger the smoothing, i.e. large time constants $\tau_A$, $\tau_R$, the lower the achieved compression. For obtaining the best possible perceptual quality, the parameter values for the filtering time constants are chosen depending on the desired compression gain parameter G.

$$\tau_A \approx -0.0002 \text{ sec/dB} \cdot G + 0.006 \text{ sec}$$

$$\tau_R \approx -0.0033 \text{ sec/dB} \cdot G + 0.12 \text{ sec}$$

Perceptual listening tests revealed that a linear dependency between the filtering time constants and G lead to the best results. For increasing values of G the filtering time constants can be linearly decreased.

As a result of the smoothing, it may happen that $P_s < P_x$. Therefore, an addition of a tolerance factor $\lambda \geq 1$ can be desirable to ensure that the desired compression gain parameter G can be achieved. The tolerance factor can take into account that fast transients may be missed by the attack decay and can result in high signal peaks. Therefore, the value of the tolerance factor can be chosen according to the attack filtering time constant.

$$\lambda = 1.122 + 65 \cdot 1/\text{sec} \cdot \tau_A$$

After deriving an optimal parameter setting, the time variant gain $g(t)$ can be estimated from the loudness equalized signal $x_f(t)$ $$g(t) = \begin{cases} -(1 - 1/R) \cdot (P_s(t) - T), & P_s(t) > T \\ 0, & P_s(t) \leq T \end{cases}$$

where $$P_s(t) = \begin{cases} \alpha_A P_s(t-1) + (1 - \alpha_A) P_x(t), & P_x(t) > P_s(t-1) \\ \alpha_R P_s(t-1), & P_x(t) \leq P_s(t-1) \end{cases}$$

and $$\alpha_R = e^{-1/\tau_R}, \alpha_A = e^{-1/\tau_A}$$

Finally, the gain can be multiplied or amplified by the desired compression gain parameter G and finally multiplied to the original input signal x(t), and not to the loudness equalized signal. This can provide best possible quality as the original signal may not be altered by the loudness model but only by the loudness-corrected gain.

$$x_c(t) = x(t) \cdot 10^{G/20} \cdot g(t)$$

Figure 12:
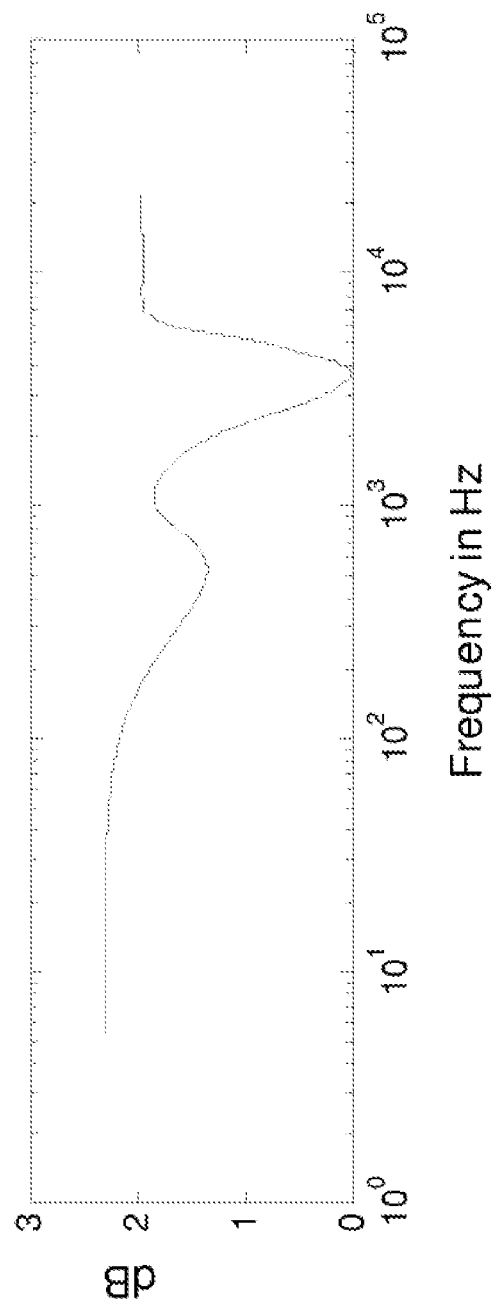
FIG. 12 shows a diagram of a frequency response of an equalization filter according to an implementation form.

FIG. 12 shows a diagram of a frequency response of an equalization filter according to an implementation form.

As optional post processing step, an equalization filter can be applied to the signal. Equalization can be desired to compensate for the frequency dependent dynamic range compression. Frequency ranges which are enhanced by the loudness model can be compressed stronger and can therefore receive a lower level than frequencies which are attenuated by the loudness model. While this approach can ensure that dynamic range compression can be concentrated in frequency ranges where the human ear is less sensitive to compression artifacts, it can also result in the output signal not having a flat frequency response. To compensate for this effect, again filtering with a variant of an equal loudness curve can be used.

The filter response as shown in FIG. 12 can be adjusted to compensate for the non-linear compression resulting from the preprocessing filter for equal loudness influencing the computation of the gain g(t). Because the gain g(t) is derived from the loudness equalized signal but is applied to the original input signal, the compressed signal typically may not have a flat frequency response. In particular, low and high frequencies can be attenuated. The filter response shown in FIG. 12 can be designed for compensating this effect in the case of an exemplary compression using a threshold T=12 dB and a ratio of 2:1 resulting in a compression gain G of 6 dB. In this case, low and high frequencies can be amplified by roughly 2 dB in order to achieve a flat frequency response. For different values of G the response can be linearly scaled.

The equalization can be desirable to compensate for the frequency dependent dynamic range compression. A filtering with a variant of an equal loudness curve can be used. Potentially, the equalization depends on the compression gain. Also, the target output device may be considered to define the equalization.

Figure 13:
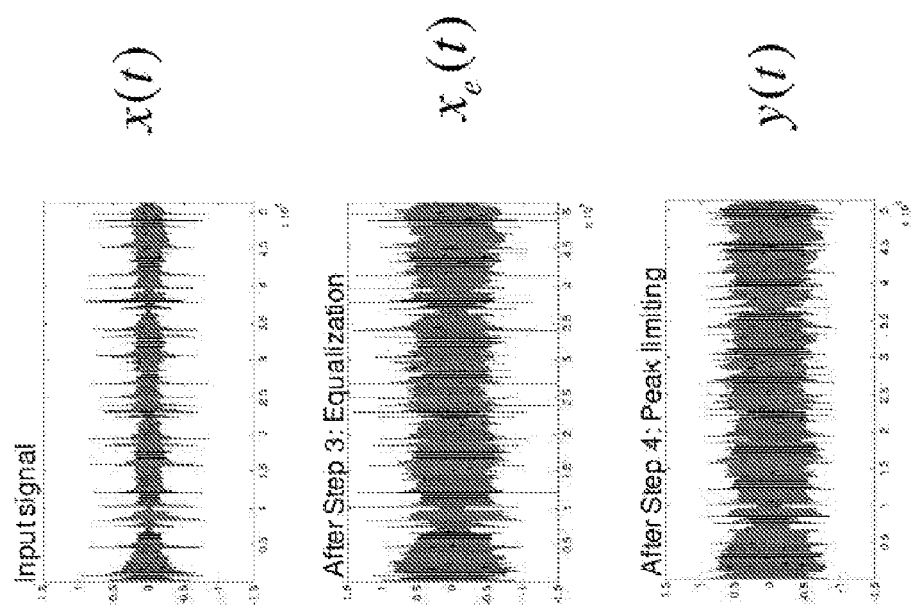
FIG. 13 shows a diagram illustrating an effect of the digital compressor on an input audio signal according to an implementation form.

FIG. 13 shows a diagram illustrating an effect of the digital compressor on an input audio signal according to an implementation form. The digital compressor can comprise a dynamic range compression system. The first waveform shows an input signal x(t), the second waveform shows an audio signal $x_c(t)$ after step three, i.e. equalization, and the third waveform shows an audio signal y(t) after step four, i.e. peak limiting.

As final step, a peak limiter can be applied to prevent clipping in the output signal. Clipping can refer to the amplitude of the signal exceeding the maximum possible value Pmax. Because of the temporal smoothing performed with the time constants $\tau_R$, $\tau_A$, fast and strong transients, e.g. drum hits, may not be compressed. As a result, quick changes in signal level can be preserved in the output signal which can be an important aspect to ensure a high perceptual quality or signal clarity. However, these peaks can also prevent that the desired compression gain G can be achieved without introducing clipping. One straight forward solution to this issue can be to decrease the time constants used in the dynamic range compression module. But this can reduce the quality.

A high sound quality can be achieved while avoiding clipping when adding a peak limiter as a final processing step. The peak limiter can be a dynamic range compressor which can be tuned to just affect the remaining peaks of the signal. To this end, the threshold T can be set to a high threshold, e.g. T=−1 dB, and the compression ratio can also be high, e.g. R=60:1. Together with small values for the attack and release time constants, these settings can assure that any peak exceeding the threshold, thus leading to clipping, can be compressed by a very large ratio, e.g. R=60:1. As a result, peaks exceeding the threshold can strongly be compressed or soft-clipped to ensure that they do not exceed this threshold.

The slow dynamic range compression performed by the dynamic range compression module can ensure that slowly evolving long- and mid-term characteristics of the audio signal can be retained by the compression and the fast reacting peak limiter can perform soft-clipping to only prevent clipping. In combination, signal quality, in particular signal clarity, can be retained as much as possible while still ensuring a high compression gain.

FIG. 13 compares an input signal x(t) with a compressed signal after an equalization $x_e(t)$ as well as the final output signal after the peak limiting y(t).

After the dynamic range compression, mid-term level characteristics of the signal can be retained but peaks exceeding amplitude values of [−1;+1] can remain in the signal xe(t). These can finally be soft-clipped by the peak limiter to obtain the signal y(t).

Figure 14:
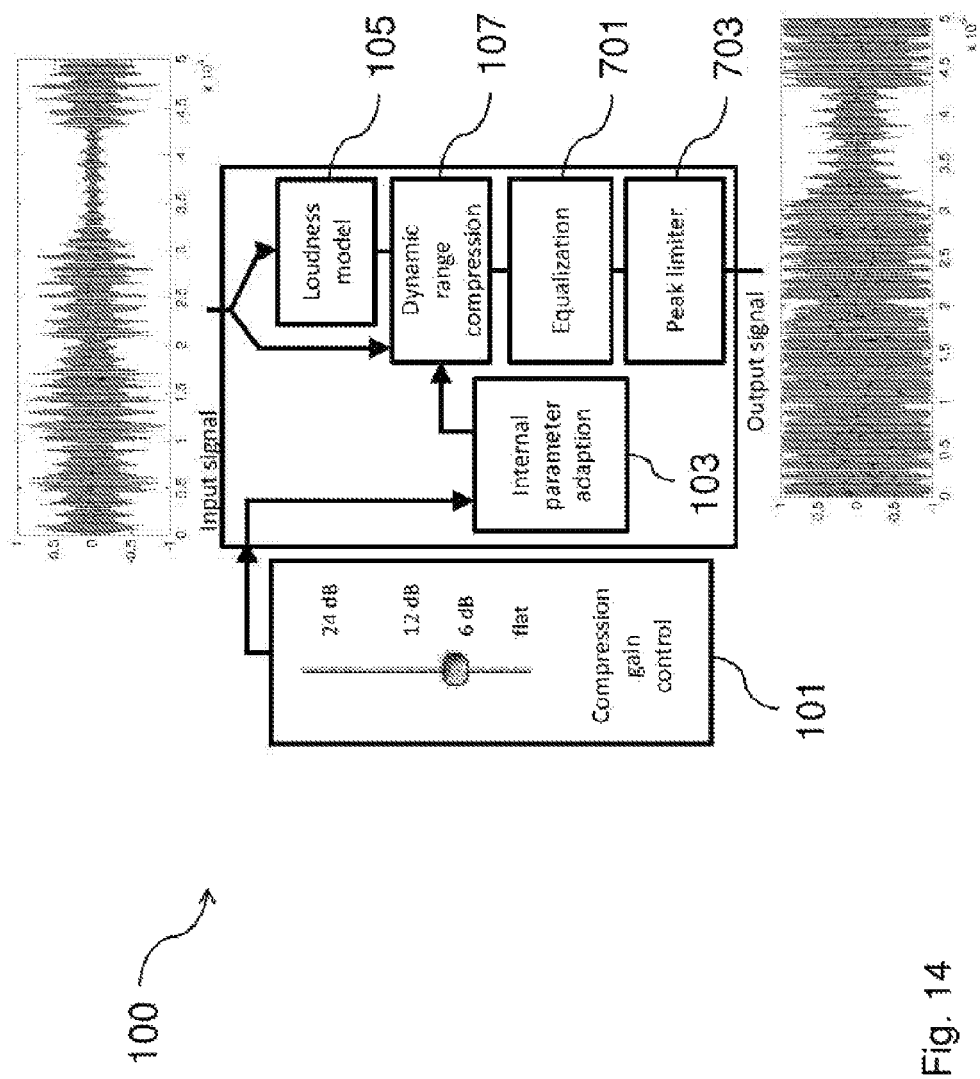
FIG. 14 shows a diagram of a digital compressor for compressing an input audio signal according to an implementation form.

FIG. 14 shows a diagram of a digital compressor 100 for compressing an input audio signal according to an implementation form. The digital compressor 100 can comprise a dynamic range compression system.

The digital compressor 100 comprises a compression gain control 101, a compression parameter determiner 103 for internal parameter adaption, an auxiliary signal generator 105 using a loudness model, a combiner unit 107 for dynamic range compression, an equalization filter 701, and a peak limiter 703. An input audio signal can be provided to the auxiliary signal generator 105 and to the combiner unit 107. A compressed output audio signal can be provided by the peak limiter 703.

Applying a simplified loudness model, i.e. a filter with an equal loudness curve, can emphasize frequencies where the human ear is less sensitive. A dynamic range compression can be achieved. Because of the loudness model, the compression can be stronger in regions where the ear is less sensitive and compression artifacts can be less audible. Applying an equalization to correct for the frequency dependent compression and to recreate a flat frequency response can be desirable. A peak limiter to prevent clipping in strong attack phases can be employed.

Figure 15:
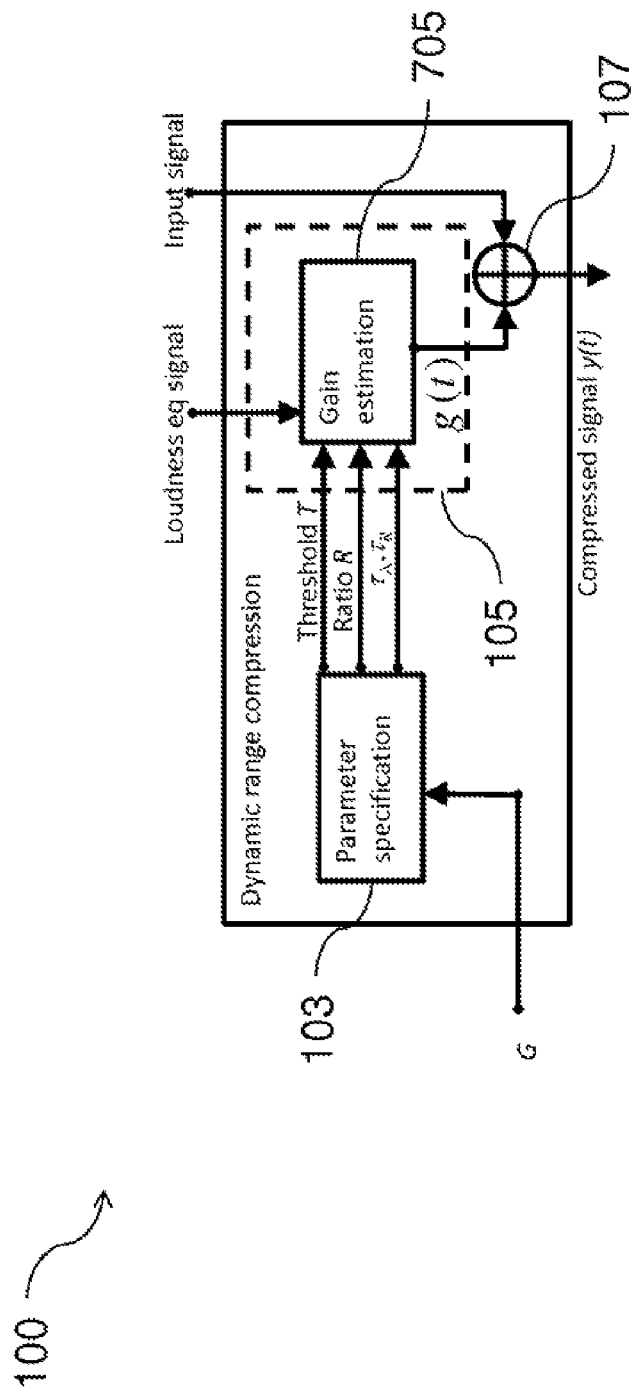
FIG. 15 shows a diagram of a digital compressor for compressing an input audio signal according to an implementation form.

FIG. 15 shows a diagram of a digital compressor 100 for compressing an input audio signal according to an implementation form. The digital compressor 100 can comprise a dynamic range compression system.

The digital compressor 100 can comprise a compression parameter determiner 103 for parameter specification, an auxiliary signal generator 105 with a gain estimation unit 705, and a combiner unit 107. The compression parameter determiner 103 can provide a compression threshold, a compression ratio, an attack filtering time constant, and a release filtering time constant to the auxiliary signal generator 105. A loudness equalized audio signal can be provided to the auxiliary signal generator 105. An input audio signal can be provided to the combiner unit 107. A compressed audio signal y(t) can be provided by the combiner unit 107.

A dynamic range compression can be achieved. A gain can be estimated from the loudness equalized signal and applied to the original input signal. Simplifying parameter settings of the dynamic range compression can be desirable. The user can specify a desired compression gain G in a continuous fashion. Parameters for the dynamic range compression T, R, $\tau_A$, $\tau_R$ can be derived and can be provided to the DRC algorithm. Because it may be that $P_s < P_x$, a tolerance factor $\lambda \geq 1$ can be added to obtain the desired compression gain parameter G.

Figure 16:
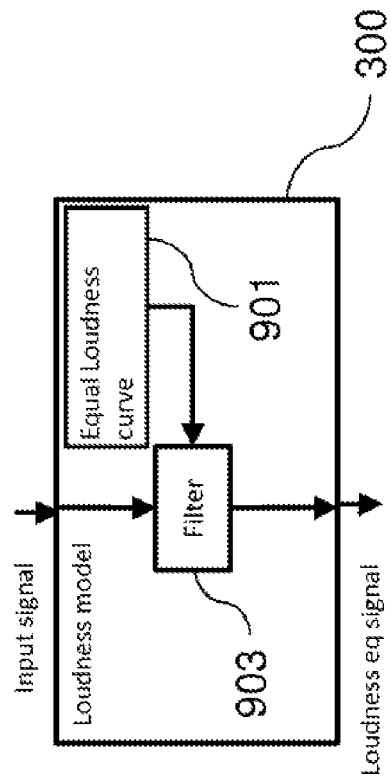
FIG. 16 shows a diagram of a digital filter for filtering an input audio signal according to an implementation form.

FIG. 16 shows a diagram of a digital filter 300 for filtering an input audio signal according to an implementation form. The digital filter 300 can comprise a filter equal loudness module.

The digital filter 300 can comprise a determining unit 901 using an equal loudness curve, and a filtering unit 903. The filtering unit 903 can filter an input audio signal to provide a loudness equalized audio signal. The digital filter 300 can be based on a loudness model.

The disclosure can be specifically tailored for applications on mobile devices with limited electro-acoustic systems, processing capabilities and power consumption.

A higher sound quality can be provided. Compression artifacts can be concentrated in frequency ranges with less sensitivity of the human ear. A combination of slow compression and fast peak limiting can preserve the original properties of both, slow and fast components of the signal as much as possible. A perceptual clarity can be preserved. A user controllable strength of the compression can be provided. A single compression gain parameter to specify desired compression gain can be employed. It can be continuously adjustable to adapt to the signal content and/or the listening environment. A computational simple implementation can be provided. A full-band processing instead of a frequency domain and/or sub-band processing can be employed. A low delay can be achieved as no frequency transform and/or sub-band decomposition may be employed.

In an implementation form, the disclosure relates to a method and apparatus for enhanced dynamic range compression of audio signals comprising a full-band model of human sound perception to consider the frequency characteristic of the sensitivity of the human ear, and a cascaded dynamic range compression and soft-clipping system to reduce the level of transients while retaining signal clarity.

In an implementation form, the disclosure relates to the method and apparatus, further comprising a unit to let the user control a single control parameter for the compression gain in a continuous fashion, and an internal converter to derive optimal parameter settings from the specified compression gain parameter.

In an implementation form, the disclosure relates to a terminal and/or decoder feature.

What is claimed is:

1. A digital compressor comprising:
an input for receiving an input audio signal;
a processor coupled to the input and configured to:
provide a compression gain parameter;
weight the compression gain parameter by a predetermined weight factor to obtain a compression ratio;
manipulate the input audio signal in dependence of the compression ratio to obtain a first auxiliary signal;
combine the first auxiliary signal with the compression gain parameter to obtain a second auxiliary signal;
combine the input audio signal with the second auxiliary signal to obtain a compressed audio signal;
determine a compression threshold from the compression gain parameter according to the following equation:

$$T = P_{max} - G \cdot \lambda (1 + 1/R),$$

wherein G denotes the compression gain parameter in a logarithmic scale, wherein $\lambda$ denotes a tolerance factor, wherein R denotes the compression ratio, wherein $P_{max}$ denotes a maximum magnitude of the input audio signal in a logarithmic scale, and wherein T denotes the compression threshold in a logarithmic scale; and
manipulate the input audio signal to obtain the first auxiliary signal further by comparing the input audio signal with the compression threshold.

2. The digital compressor of claim 1, wherein the processor is configured to determine the compression ratio according to the following equation:

$$R = G/K, \text{ or } R \approx G/K,$$

wherein G denotes the compression gain parameter, wherein K denotes the predetermined weight factor, and wherein R denotes the compression ratio.

3. The digital compressor of claim 1, wherein the processor is further configured to:
determine an attack filtering time constant from the compression gain parameter according to the following equation:

$$\tau_A = A_1 \cdot G + A_2,$$

wherein G denotes the compression gain parameter in a logarithmic scale, wherein $A_1$ denotes a first predetermined attack constant, wherein $A_2$ denotes a second predetermined attack constant, and wherein $\tau_A$ denotes the attack filtering time constant; and
manipulate the input audio signal to obtain the first auxiliary signal further by filtering the input audio signal in dependence of the attack filtering time constant.

4. The digital compressor of claim 1, wherein the processor is further configured to:
determine a release filtering time constant from the compression gain parameter according to the following equation:

$$\tau_R = B_1 \cdot G + B_2,$$

wherein G denotes the compression gain parameter in a logarithmic scale, wherein $B_1$ denotes a first predetermined release constant, wherein $B_2$ denotes a second predetermined release constant, and wherein $\tau_R$ denotes the release filtering time constant; and
manipulate the input audio signal to obtain the first auxiliary signal further by filtering the input audio signal in dependence of the release filtering time constant.

5. The digital compressor of claim 1, wherein the processor is further configured to filter the input audio signal by a digital filter, the digital filter comprising a frequency transfer function having a magnitude over frequency, wherein the magnitude is formed by an equal loudness curve of a human ear.

6. The digital compressor of claim 1, wherein the processor is further configured to filter the input audio signal by applying a digital low-pass filter, the digital low-pass filter comprising a filter step response in time domain.

7. The digital compressor of claim 6, wherein the digital low-pass filter is configured to filter the input audio signal according to the following equations:

$$P_s(t) = \begin{cases} \alpha_A P_s(t-1) + (1-\alpha_A)P_x(t), & P_x(t) > P_s(t-1) \\ \alpha_R P_s(t-1), & P_x(t) \le P_s(t-1) \end{cases}$$

and $$\alpha_R = e^{-1/\tau_R}, \alpha_A = e^{-1/\tau_A},$$

wherein $\tau_A$ denotes an attack filtering time constant, wherein $\tau_R$ denotes a release filtering time constant, wherein $\alpha_A$ denotes an exponential attack constant, wherein $\alpha_R$ denotes an exponential release constant, wherein t denotes a sampling time index, wherein $P_X$ denotes a magnitude of the input audio signal in a logarithmic scale, and wherein $P_S$ denotes a magnitude of the filtered audio signal in a logarithmic scale.

8. The digital compressor of claim 1, wherein the processor is further configured to determine a magnitude of the first auxiliary signal according to the following equation:

$$g(t) = \begin{cases} -(1-1/R) \cdot (P_s(t) - T), & P_s(t) > T \\ 0, & P_s(t) \le T \end{cases},$$

wherein R denotes the compression ratio, wherein T denotes a compression threshold in a logarithmic scale, wherein $P_S$ denotes a magnitude of the input audio signal in a logarithmic scale, wherein t denotes time, and wherein g(t) denotes a magnitude of the first auxiliary signal in a logarithmic scale.

9. The digital compressor of claim 1, wherein the processor is further configured to combine the first auxiliary signal with the compression gain parameter to obtain the second auxiliary signal further by multiplying the first auxiliary signal by the compression gain parameter.

10. The digital compressor of claim 1, wherein the processor is further configured to multiply the input audio signal by the second auxiliary signal to obtain the compressed audio signal.

11. The digital compressor of claim 1, wherein the processor is further configured to apply an equalization filter for filtering the compressed audio signal, wherein the equalization filter comprises a frequency transfer function having a magnitude over frequency, and wherein the magnitude is formed by an equal loudness curve of a human ear.

12. The digital compressor of claim 1, wherein the processor is further configured to apply a peak limiter for reducing a maximum magnitude of the compressed audio signal in time domain.

13. A digital compressing method comprising:
receiving an input audio signal;
providing a compression gain parameter;
determining a compression ratio from the compression gain parameter by weighting the compression gain parameter by a predetermined weight factor to obtain the compression ratio;
manipulating the input audio signal in dependence of the compression ratio to obtain a first auxiliary signal;
combining the first auxiliary signal with the compression gain parameter to obtain a second auxiliary signal;
combining the input audio signal with the second auxiliary signal to obtain a compressed audio signal;
determining a compression threshold from the compression gain parameter according to the following equation:

$$T = P_{max} - G \cdot \lambda(1+1/R),$$

wherein G denotes the compression gain parameter in a logarithmic scale, wherein $\lambda$ denotes a tolerance factor, wherein R denotes the compression ratio, wherein $P_{max}$ denotes a maximum magnitude of the input audio signal in a logarithmic scale, and wherein T denotes the compression threshold in a logarithmic scale; and
manipulating the input audio signal to obtain the first auxiliary signal further by comparing the input audio signal with the compression threshold.

14. The method according claim 13, wherein the compression ratio is determined according to the following equation:

$$R = G/K, \text{ or } R \approx G/K,$$

wherein G denotes the compression gain parameter, wherein K denotes the predetermined weight factor, and wherein R denotes the compression ratio.

15. The method according to claim 13, further comprising:
determining an attack filtering time constant from the compression gain parameter according to the following equation:

$$\tau_A = A_1 \cdot G + A_2,$$

wherein G denotes the compression gain parameter in a logarithmic scale, wherein $A_1$ denotes a first predetermined attack constant, wherein $A_2$ denotes a second predetermined attack constant, and wherein $\tau_A$ denotes the attack filtering time constant; and
manipulating the input audio signal to obtain the first auxiliary signal further by filtering the input audio signal in dependence of the attack filtering time constant.

16. The method according to claim 13, further comprising:
determining a release filtering time constant from the compression gain parameter according to the following equation:

$$\tau_R = B_1 \cdot G + B_2,$$

wherein G denotes the compression gain parameter in a logarithmic scale, wherein $B_1$ denotes a first predetermined release constant, wherein $B_2$ denotes a second predetermined release constant, and wherein $\tau_R$ denotes the release filtering time constant; and
manipulating the input audio signal to obtain the first auxiliary signal further by filtering the input audio signal in dependence of the release filtering time constant.

17. The method according to claim 13, further including filtering the input audio signal with a digital filter, the digital filter comprising a frequency transfer function having a magnitude over frequency, wherein the magnitude is formed by an equal loudness curve of a human ear.

18. The method according to claim 13, further including filtering the input audio signal with a digital low-pass filter, the digital low-pass filter comprising a filter step response in a time domain.

* * * * *

UNITED STATES PATENT AND TRADEMARK OFFICE
CERTIFICATE OF CORRECTION

PATENT NO. : 9,985,597 B2
APPLICATION NO. : 15/082081
DATED : May 29, 2018
INVENTOR(S) : Peter Grosche, Yue Lang and Qing Zhang It is certified that error appears in the above-identified patent and that said Letters Patent is hereby corrected as shown below:

On the Title Page

Under Notice should read:
Subject to any disclaimer, the term of this patent is extended or adjusted under 35 U.S.C. 154(b) by 0 days.

Signed and Sealed this
Tenth Day of July, 2018

Andrei Iancu
*Director of the United States Patent and Trademark Office*